United States Patent
Albin et al.

(10) Patent No.: US 9,054,264 B2
(45) Date of Patent: Jun. 9, 2015

(54) SYSTEMS AND METHODS FOR SOLAR CELLS WITH CIS AND CIGS FILMS MADE BY REACTING EVAPORATED COPPER CHLORIDES WITH SELENIUM

(71) Applicant: Alliance for Sustainable Energy, LLC, Golden, CO (US)

(72) Inventors: David S. Albin, Denver, CO (US); Rommel Noufi, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 180 days.

(21) Appl. No.: 13/779,363

(22) Filed: Feb. 27, 2013

(65) Prior Publication Data

US 2013/0224903 A1     Aug. 29, 2013

Related U.S. Application Data

(60) Provisional application No. 61/604,792, filed on Feb. 29, 2012.

(51) Int. Cl.
| | |
|---|---|
| *H01L 31/18* | (2006.01) |
| *H01L 21/02* | (2006.01) |
| *H01L 31/032* | (2006.01) |
| *C23C 14/06* | (2006.01) |
| *C23C 14/22* | (2006.01) |
| *C23C 16/30* | (2006.01) |
| *C23C 16/44* | (2006.01) |

(52) U.S. Cl.
CPC .......... *H01L 31/18* (2013.01); *H01L 21/02568* (2013.01); *H01L 31/0322* (2013.01); *H01L 21/02422* (2013.01); *H01L 21/02491* (2013.01); *H01L 21/02614* (2013.01); *H01L 21/02631* (2013.01); *C23C 14/0623* (2013.01); *C23C 14/22* (2013.01); *C23C 16/305* (2013.01); *C23C 16/44* (2013.01); *Y02E 10/541* (2013.01)

(58) Field of Classification Search
CPC .............. H01L 31/18; H01L 21/02568; H01L 31/0322; H01L 21/02422; H01L 21/02491; H01L 21/02631; C23C 14/0623
USPC .......................................................... 438/95
See application file for complete search history.

(56) References Cited

U.S. PATENT DOCUMENTS

| | | |
|---|---|---|
| 5,356,839 A | 10/1994 | Tuttle et al. |
| 5,436,204 A | 7/1995 | Albin et al. |
| 5,441,897 A | 8/1995 | Noufi et al. |

(Continued)

OTHER PUBLICATIONS

Abe, Y. et al., "Development of Flexible Cu(In,Ga)Se2 Thin Film Solar Cell by Lift-Off Process," Solar Cells—Thin-Film Technologies, edited by Leonid A. Kosyachenko, Publisher InTech, Published Nov. 2, 2011, Chapter 19, pp. 405-420.

(Continued)

*Primary Examiner* — Savitr Mulpuri
(74) *Attorney, Agent, or Firm* — John C. Stolpa; Suzanne C. Walts; Michael A. McIntyre

(57) ABSTRACT

Systems and methods for solar cells with CIS and CIGS films made by reacting evaporated copper chlorides with selenium are provided. In one embodiment, a method for fabricating a thin film device comprises: providing a semiconductor film comprising indium (In) and selenium (Se) upon a substrate; heating the substrate and the semiconductor film to a desired temperature; and performing a mass transport through vapor transport of a copper chloride vapor and se vapor to the semiconductor film within a reaction chamber.

30 Claims, 3 Drawing Sheets

(56) References Cited

U.S. PATENT DOCUMENTS

| | | | |
|---|---|---|---|
| 5,731,031 A | 3/1998 | Bhattacharya et al. | |
| 6,518,086 B2* | 2/2003 | Beck et al. | 438/95 |
| 8,501,524 B2* | 8/2013 | Cho et al. | 438/95 |
| 2007/0184576 A1* | 8/2007 | Chang et al. | 438/104 |
| 2010/0236630 A1* | 9/2010 | Kim et al. | 136/262 |
| 2011/0120545 A1 | 5/2011 | Auman et al. | |
| 2011/0139251 A1 | 6/2011 | Robinson et al. | |
| 2011/0189815 A1 | 8/2011 | Sager et al. | |
| 2011/0312122 A1* | 12/2011 | Lee | 438/86 |
| 2013/0130475 A1* | 5/2013 | Barden et al. | 438/478 |
| 2013/0230933 A1* | 9/2013 | Li | 438/14 |

OTHER PUBLICATIONS

Albin, D.S. et al., "The Formation of Large-Grain CuInSe2 Films by Selenization by High-Rate Se Transport Under Moderate Vacuum Conditions," Journal of Electronic Materials, vol. 24, No. 4, 1995, pp. 351-357.

Malik, S.N., "Preparation of CuInSe2 and CuInGaGe2 nanoparitcles and thin films for solar cells applications," A Thesis submitted to the University of Manchester, School of Chemistry, The University of Manchester 2010.

Ramanathan, K. et al., "High-Efficiency Cu(In,Ga)Se2 Thin Film Solar Cells Without Intermediate Buffer Layers," NREL/CP-520-23898, presented at the 2nd World Conference and Exhibition on Photovoltaic Solar Energy Conversion, Jul. 6-10, 1998, Vienna, Austria.

Romeo, A. et al., "Development of Thin-film Cu(In,Ga)Se2 and CdTe Solar Cells," Progress in Photovoltaics: Research and Applications 2004; 12:93-111.

International Search Report and Written Opinion dated Jun. 17, 2013 for PCT/US13/28078 filed Feb. 27, 2013 entitled Systems and Methods for Forming Solar Cells with CuInSe2 and Cu(In,Ga)Se2 Films—NREL PCT/09-72.

\* cited by examiner

US 9,054,264 B2

SYSTEMS AND METHODS FOR SOLAR CELLS WITH CIS AND CIGS FILMS MADE BY REACTING EVAPORATED COPPER CHLORIDES WITH SELENIUM

CROSS-REFERENCE TO RELATED APPLICATIONS

This application claims the benefit of and priority to U.S. Provisional Application No. 61/604,792 entitled "Solar Cells with CuInSe$_2$ and Cu(In,Ga)Se$_2$ films made by reacting evaporated copper, indium, and gallium chlorides with selenium" filed on Feb. 29, 2012, which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Solar cells are devices that have characteristics that enable them to convert the energy of sunlight into electric energy. The aim of research often is to achieve solar cell designs that are suitable for inexpensive commercial production while providing acceptably high energy conversion efficiencies.

A conventional thin film solar cell is composed of a stacking of thin layers on a rigid or flexible substrate, and the thin layers form one or more junctions that absorb light and convert it into electricity. Briefly, a typical thin film PV device such as a thin film solar cell may include a glass, metal, or polymer substrate, a back contact, an absorber, a window layer, a front contact or low resistivity layer, and a top protective layer (e.g., a glass substrate) or a similar arrangement of thin film layers. Presently, many thin film solar cells are fabricated with an absorber or absorber layer formed of copper indium diselenide ("CIS") or copper indium gallium diselenide ("CIGS") because an absorber formed of either material has a high optical absorption coefficient and suitable optical and electrical characteristics. With regard to CIS and CIGS solar cells, work continues to provide better methods of producing a CIS or CIGS thin film layer that is of proper composition and structure to allow charges generated by received sunlight (i.e., electrons and holes) to exist long enough in the CIS and CIGS layer of the device so that they can be separated and collected at the front and back contacts to provide higher conversion efficiency.

Commercial production of solar cells includes growth of thin films including a CIS or CIGS absorber using a variety of processes. A coevaporation process may be used to produce a thin film by concurrently evaporating copper (Cu), indium (In), gallium (Ga), and selenium (Se) from elemental sources. Even with precise control over evaporation rates, it has proven difficult to obtain a homogenous thin film with a desired roughness and uniform thickness. In other commercial production lines, selenization from selenium vapor is used to form the CIS or CIGS absorber for a solar cell. In a typical process, a substrate is provided that is a soda lime glass coated with a thin film of molybdenum (Mo), as the back contact of the solar cell. Cu and In,Ga layers are sequentially deposited on the substrate by a vapor deposition process such as sputtering. The different layers are thermally selenized in an H$_2$Se or Se-containing atmosphere and then converted into a CIS or CIGS thin film. An advantage of this process compared with the coevaporation process is that large area depositions of CIS or CIGS films can be produced commercially.

Researchers studying techniques for fabricating higher efficiency solar cells designed an improved method of forming a Cu(In,Ga)Se$_2$ film. Particularly, a three-stage process is taught in U.S. Pat. No. 5,441,897 by Noufi. Briefly, the three stages include: deposition to form a thin film of In$_x$Se; addition of copper to the In$_x$Se film to form a Cu-rich CIS film; and addition of In$_x$Se to the Cu-rich CIS film to form a Cu-poor CIS film. It has been shown that a CIS (or CIGS) film provides a more effective absorber in a solar cell when there is less than a one-to-one ratio of the copper to indium (Cu-poor) (or less than a one-to-one ratio of the copper to (indium+gallium) for CIGS) at or near the surface of the absorber that abuts the window or provides the junction with the cadmium sulfide (CdS) or other thin film of the solar cell. For example, high efficiency thin film solar cells may be formed with a Cu-poor region with 22-24.5 at % Cu.

To date, though, solar cell manufacturers have found it difficult to form a Cu-rich CIS or CIGS thin film and then selectively reduce the amount of copper to form a Cu-poor region (e.g., a Cu-poor surface at CIS/CdS junction or interface). Some efforts have been made to utilize copper to substitute for indium in the step of forming a Cu-rich CIS thin film. However, this involves a chemical process or chemical vapor deposition (CVD) requiring very high temperatures (e.g., 1200° C. or the like), which are undesirable in commercial production settings as it increases energy costs and requires significant engineering to provide the high temperature CVD environment.

The foregoing examples of the related art and limitations related therewith are intended to be illustrative and not exclusive. Other limitations of the related art will become apparent to those of skill in the art upon a reading of the specification and a study of the drawings.

BRIEF DESCRIPTION OF THE DETAILED DRAWINGS

Exemplary embodiments are illustrated in referenced figures of the drawings. It is intended that the embodiments and figures disclosed herein are to be considered illustrative rather than limiting.

In accordance with common practice, the various described features are not drawn to scale but are drawn to emphasize relevant features. Reference characters denote like elements throughout Figures and text.

DETAILED DESCRIPTION

The following description is directed generally to a method of fabricating solar cells with a CIS or CIGS thin film or absorber with a copper (Cu)-poor region. More particularly, the following description teaches embodiments for manufacturing CuInSe$_2$ and Cu(In,Ga)Se$_2$ films for solar cells. These embodiments include, but are not limited to, methods that comprise reacting evaporated copper chlorides (which in this disclosure refer to a $CuCl_x$ where $x>0$, but typically $x=1$, 2 or 3), indium, and (in some implementations) gallium with selenium.

The various embodiments described herein are designed with the recognition of the desirability of making the thin film copper poor (ratio of Cu to (In+Ga) or Group I to Group III ratio of less than one (1) such as with 19 to 24.5 at % Cu in a region or near the surface opposite the substrate/back contact. For example, polycrystalline thin films of p-type $CuInSe_2$ and $Cu(In,Ga)Se_2$ produce high efficiency heterojunction solar cells when the composition of the film at the corresponding interface with the n-type window layer (e.g., CdS+ZnO) is not stoichiometric, but, rather, is slightly Cu deficient (or includes a Cu-poor region). A stoichiometric $CuInSe_2$ composition would, for example, be 25 at % Cu, 25 at % In, and 50 at % Se while a corresponding Cu-deficient composition would involve Cu concentrations of approximately 19 to 24 at % Cu.

Using elemental copper to replace indium in a film of $In_xSe$ requires very high temperatures (e.g., 1200° C. and higher) to heat the Cu to achieve a Cu transport. In contrast, embodiments described herein utilize vapor deposition or physical processes, for example, to provide copper to an $In_xSe$ thin film by heating copper chloride ($CuCl_x$) to provide $CuCl_x$ vapor. Benefits provided by one or more of the described embodiments include a high growth rate of the thin film (micrometers per minute rather than merely angstroms per second) by providing a high mass transport rate (e.g., due in part to the high vapor pressure of $CuCl_x$) and an acceptable reaction rate.

Figure 1:
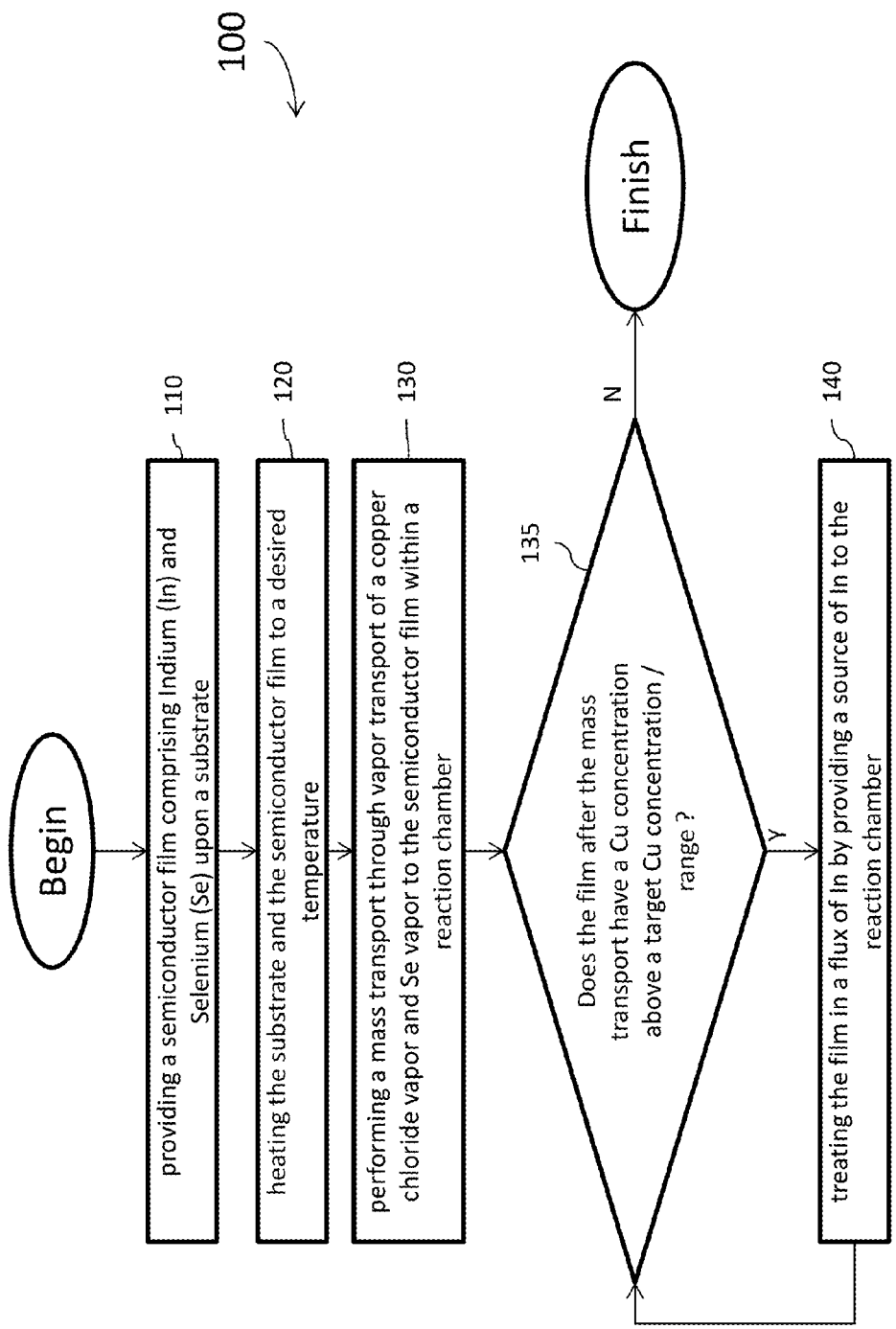
FIG. 1 is flow chart illustrating a method of one embodiment of the present disclosure for a forming a CIS or CIGS film.

In FIG. 1, one embodiment for a method of fabricating $CuInSe_2$ (CIS) and $Cu(In,Ga)Se_2$ (CIGS) films for solar cells is described generally at 100. Method 100 may be generally described as using vapor transport (or physical transport) and then a chemical reaction in the film to provide physical and chemical deposition. However, as explained below, method 100 does not describe a typical chemical vapor deposition (CVD). That is, the thin film deposition methods disclosed herein may be described as a hybrid physical and chemical deposition reaction where the reactants are not byproducts of a reaction. Instead, the reactants are physically transported to the reactor to facilitate the desired chemical reaction in the thin film to form a Cu-poor CIS or CIGS film. The use of vapor transport lends itself to commercial deposition techniques such as hot injectors (e.g., lateral injectors or the like), which improves the resulting spatial and/or compositional uniformity in the film as it provides "pre-mixing" upstream of the reaction chamber in contrast to co-evaporation processes in which mixing occurs only within the reaction chamber. With method 100, either CIS or CIGS films are made by reacting evaporated copper chloride, indium, and (for CIGS films) gallium with selenium.

The method begins at 110 with providing a semiconductor film comprising Indium (In) and Selenium (Se) upon a substrate. For example, providing a semiconductor film may be performed by depositing a film of $In_xSe$ (for a CIS embodiment) or $(In,Ga)_xSe$ (for a CIGS embodiment) upon a substrate. In one embodiment, the substrate comprises a glass substrate with a back contact such as a coating of molybdenum. In alternate implementations, the $In_xSe$ deposited onto the substrate can be made, for example, by 1) evaporating from a compound $In_xSe$ source, 2) evaporating from a compound $In_xSe$ source and an elemental Se source, or 3) evaporating from an elemental In source and elemental Se source. Similarly, $(In,Ga)_xSe$ may be deposited by further including Ga. One useful example implementation of method 100 includes heating $In_xSe$ films deposited on molybdenum (Mo)-coated glass substrates. The molybdenum film or coating provides the back metallic conductor of a solar cell formed with the Cu-deficient film, and the method of depositing the Mo and then the $In_xSe$ may be varied to practice the method described herein.

The method proceeds to 120 where either a Cu-poor or Cu-rich film is formed by heating the substrate and the semiconductor film to a desired temperature (for example, a temperature within a range from 475 to 525° C.) and then proceeding to 130 with performing a mass transport through vapor transport of a copper chloride vapor and Se vapor to the semiconductor film within a reaction chamber. In one embodiment, performing mass transport at block 130 may include using a source of a Group I chloride (such as $CuCl_x$) that is heated to a relatively low temperature (e.g., 274 to 310° C. or higher) and also a source of selenium to provide an overpressure of Se in the reaction chamber. In one implementation, the method further includes exposing the films to vapors from heated sources of solid $CuCl_x$ and molten selenium. The concentration of selenium in both the starting $In_xSe$ film as well as the subsequent vapor treatment ($CuCl_x$+ Se vapor) determines the resulting composition of the thin film. In this thin film deposition method, the Group I chloride is used to allow low temperatures to be used to obtain high rates of mass transport as the process involves going directly from solid to vapor (e.g., to provide a carrier gas/vapor of $CuCl_x$), which can be provided using a hot injector (e.g. 300° C.) such as a lateral injector.

Proceeding to block 135, when the film produced from the mass transport is either Cu-rich, or results in a Cu-deficient composition having Cu concentrations above a target concentration or range (e.g., such as target Cu concentration range of approximately 19 to 24 at % Cu), the method may proceed to 140, with treating the film in a flux of In by treating the film in a flux of In by providing a source of In to the reaction chamber. In alternate implementations, the source of In provided in the reaction chamber may comprise either the compound $In_xSe$ or element In. Further the source of In may be provided either with or without an overpressure of Se in the reaction chamber. Where the film is a CIGS film, treating the film in the reaction chamber at block 140 alternately includes treating the film in a flux of In and Ga by providing sources of In and Ga in the reaction chamber.

Under some conditions (e.g. temperatures and selenium activity), the composition of the film remains Cu-deficient regardless of how much $CuCl_x$ is used in the vapor treatment step at block 130. Under such conditions, method 100 represents a compositionally self-regulating method that can readily be adopted by commercial manufacturers. Specifically, the resulting Cu-poor film can be used to fabricate high efficiency $CuInSe_2$ or $Cu(In,Ga)Se_2$ solar cells. In one such implementation, the high vapor pressure of $CuCl_x$ at block 130 can be used as a way to maintain the desired Cu-poor nature of the surface (e.g., the surface layer used as a junction or contact surface for the n-type window of a solar cell).

Under other conditions of temperatures and selenium activity, the composition of the film resulting from block 130 can be intentionally made Cu-rich. The result of a Cu-rich film after exposing the $In_xSe$ film to vapors of copper chloride and selenium is useful, for example, when it is desired to provide an absorber or thin film with a copper-content gradient from Cu-rich near the back contact (e.g., Group I metal to Group III metal ratio greater than 1 near the Mo coating on the glass substrate) to Cu-poor near the n-type window junction surface. For example, the methods described in U.S. Pat. No. 5,441,897 may be modified such that Cu-rich $CuInSe_2$ or $Cu(In,Ga)Se_2$ film is formed using the presently-described technique involving vapor transport using $CuCl_x$ and Se. The Cu-rich film may then be made Cu-deficient by treating it in a flux of In and Se simultaneously at block 140.

From the teachings of this disclosure, it is evident that $CuCl_x$ as a source of copper for creating a CIS or CIGS film has a number of technological advantages when compared with solid or elemental copper. First, due to its high vapor pressure, CuCl only needs to be heated to much lower temperature ranges such as 300 to 400° C. to get useful amounts of mass transport for thin film formation. Particularly, CuCl heated to 300° C. provides the same mass transport as Cu heated to 1200° C. Providing vapor transport at relatively low heating (or injector or injector assembly) temperatures represents a considerable cost-savings with regard to equipment design complexity and operational and maintenance costs. Second, when used in this form (i.e., $CuCl_x$ vapor), copper can be incorporated in hybrid physical-chemical deposition reactions where sequential physical and chemical reactions can be separated. Initially, $CuCl_x$ is physically transported and directed (e.g., to an injector) as a non-reacting vapor by application of moderate heat (~300° C.) between the $CuCl_x$ source and the substrate (e.g., the Mo-coated glass substrate upon which a thin film of $In_xSe$ has previously been formed/deposited). This allows for transporting Cu using lateral and other injector designs for improved cross-web compositional uniformity in the thin film (e.g., solar cell absorber). After physical transport, the Cu, In, and Ga fluxes are chemically reacted with an overpressure of Se (i.e., a concentration greater than that needed to attain stoichiometry) at the heated substrate surface. In this manner, $Cu_xSe$, $In_xSe$, or $In_xGa_{1-x}Se$ films are formed. These layers can be subsequently used to make high efficiency $CuInSe_2$ and $Cu(In,Ga)Se_2$ solar cells.

Figure 2:
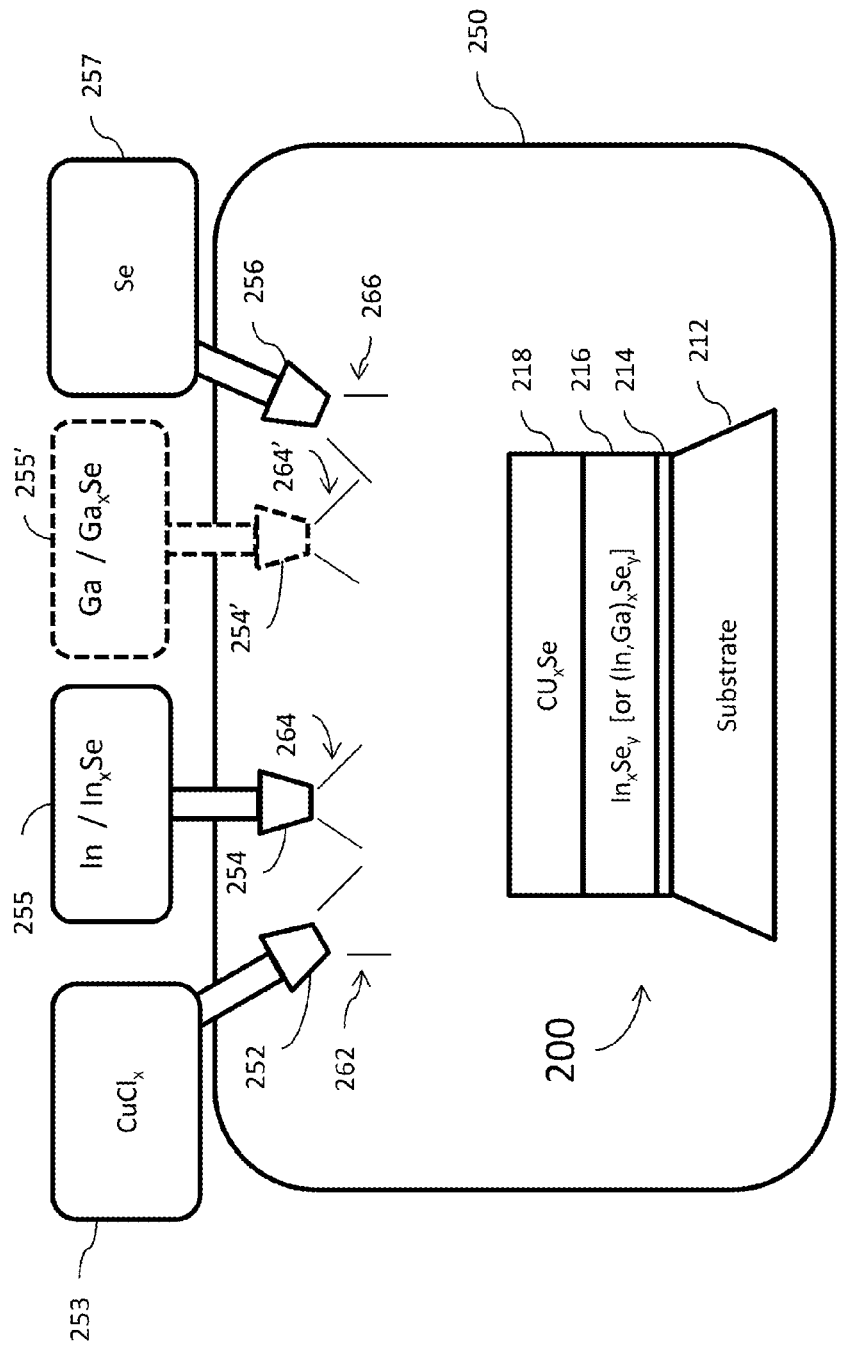
FIG. 2 is a block diagram illustrating fabrication of CIS or CIGS film device of one embodiment of the present disclosure.

FIG. 2 is a diagram illustrating fabrication of a thin film semiconductor device 200 of one embodiment of the present disclosure. In one embodiment, thin film semiconductor device 200 is fabricated according to the process described in method 100 above within a vapor chamber 250. Vapor chamber 250, in at least one implementation, includes a first supply line or injector port 252 coupled to a $CuCl_x$ vapor source 253 for introducing $CuCl_x$ vapor 262 into vapor chamber 250, and a second supply line or injector port 254 coupled to an In vapor source 255 for introducing In vapor 264 into vapor chamber 250. As mentioned above, for CIS applications the In source 255 may in alternate embodiments supply In either as elemental In or the form of a compound $In_xSe$. For CIGS applications, vapor chamber 250 may include an optional injector port 254' coupled to a Ga vapor source 255'. Ga vapor source 255' may in alternate embodiments supply Ga vapor 264' either as elemental Ga or the form of a compound $Ga_xSe$. Vapor chamber 250 also includes a supply line or injector port 256 coupled to a Se source 257 for introducing Se vapor 266 into the chamber 250.

Referring now to FIG. 2, in one embodiment, fabrication of thin film semiconductor device 200 starts by depositing a first layer of In and Se (such as $In_xSe_y$) 216 on a substrate 212 (such as described with respect to block 110, for example). The substrate 212 may be, for example, soda-lime silica glass or amorphous 7059 glass with a smooth metallic back contact surface 214, such as about one micron layer of molybdenum (Mo) or other appropriate metal. The deposition of the first layer 216 of In and Se may be by any of a variety of common techniques, such as evaporation, sputtering, electrodeposition, chemical vapor deposition, or the like. Furthermore, as discussed above, the formation of the $In_xSe_y$ in this first layer 216 can be done by either co-deposition or sequential deposition of the In and Se, or by deposition from the binary compounds, such as $In_2Se_3$ or InSe. The thickness of the $In_xSe_y$ in layer 216 deposited in this first stage is relevant in proportioning the materials deposited in the second stage, as will be described in more detail below. The substrate 212 temperature can be anywhere from ambient or room temperature to about 600° C., but for at least one embodiment is in the range of about 260° C. during deposition of the first layer 216 of $In_xSe_y$. For a CIGS application, first layer 216 would further include a deposition of Ga.

Once the first layer 216 of $In_xSe_y$ is deposited on the substrate 212 the temperature of the substrate 212 and first layer 216 is raised (for example, into a range from 475 to 600° C. such as described with respect to block 120). In any event vapor pressure or flux of Se may be introduced via supply line 256 and maintained at the substrate 212 as the temperature is being raised in order to keep from losing the In from the $In_x$ Se layer 216. Specifically, $In_2Se$ has a high vapor pressure and will evaporate as the temperature increases. Therefore, a vapor over-pressure of Se is used to prevent $In_2$ Se from forming in the $In_x Se$ layer 216 and evaporating.

When the substrate 212 temperature reaches the desired level, $CuCl_x$ vapor 262 and Se vapor 266 are introduced as reactant gasses from respective sources 253 and 255 and deposited and react at the surface of layer 216 to form $Cu_xSe$ as indicated conceptually at 218. This stage or step may involve operating the vapor chamber 250 to form a Cu-rich CIS or CIGS film. In the both of the examples provided above, this would include using the supply line 256 to provide an overpressure of Se vapor 266 and then also operating the supply line 252 to provide reactant gas 262 via an injector, with the reactant gas 262 being copper chloride vapor from chamber 253. In reality the second stage deposition of $CuCl_x$ and Se does not, of course, remain in a distinct $Cu_xSe$ layer 218, as depicted in FIG. 2. Instead, the composition becomes a homogenous thin film composition of substantially $CuInSe_2$. However, in planning the sequential depositions of the respective first and second stages, as described above, it is helpful to conceptualize them as sequential depositions of a first layer 216 of $In_xSe_y$ followed by a second layer 218 of $Cu_xSe$, even though the layers 216 and 218 do not actually remain separate or discrete compositions. The resulting CIS or CIGS film 200 may at this point be Cu-deficient, and no further deposition steps would be required to use the film 200 in a solar cell. Typically however, the flow rates of the first and second reactant gases 262 ($CuCl_x$) and 266 (Se) are controlled to cause the resulting deposited film 220 of CuInSe or Cu(In, Ga)$_x$Se at this point to be Cu-rich (e.g., the ratio of Group I to Group III metals is greater than 1 such as with 26 to 27 at % Cu or the like). In such cases where film 200 is Cu-rich, the third operating step (corresponding to block 140 in method 100) may be performed within vapor chamber 250 by operating port 254 to deposit either $In_xSe$ (in the case of CIS) or to deposit $(In,Ga)_xSe$ (in the case of CIGS) until the desired level of Cu deficiency is obtained.

Figure 3:
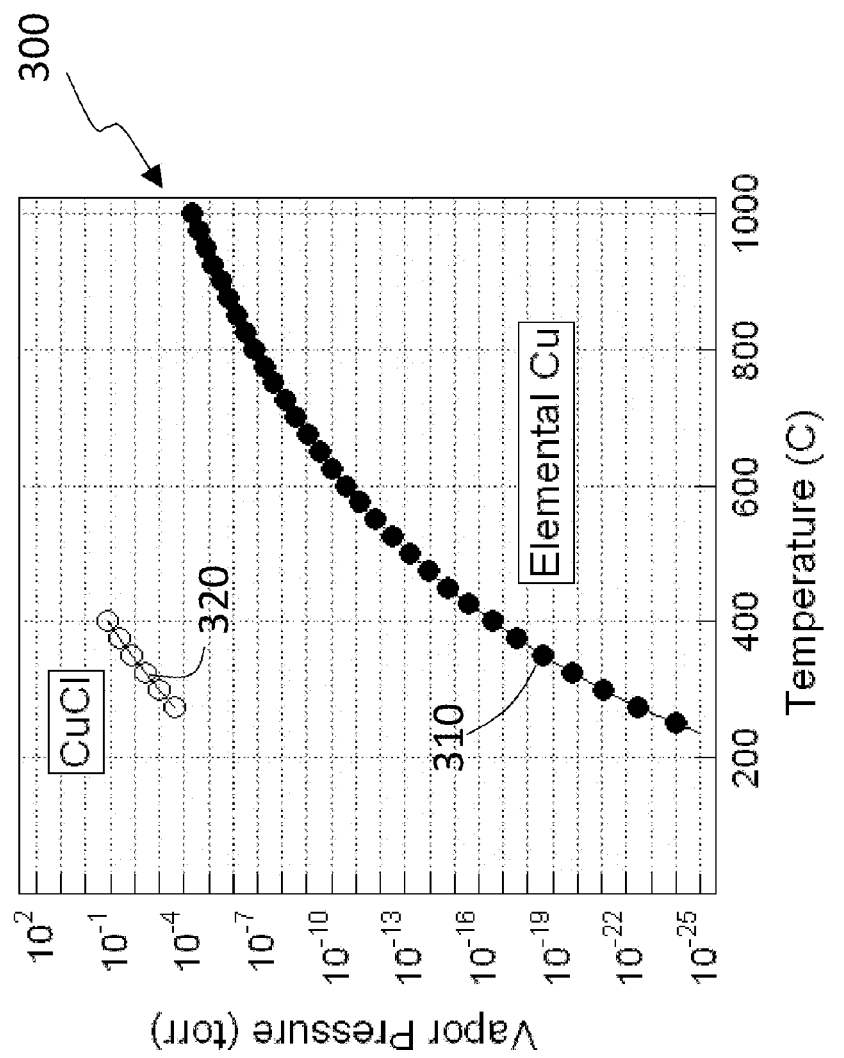
FIG. 3 is a graph or diagram showing vapor pressures versus temperature for a number of materials that may be used in deposition or film growth/formation processes.

FIG. 3 illustrates a graph or diagram 300 illustrating the vapor pressures of a number of materials that one may consider using as part of a thin film deposition or growth process. With regard to the second stage of forming a CIS or CIGS film described herein, it may be useful particularly to inspect the vapor pressures of copper and of copper chloride. With the diagram 300, it can be readily observed with line 310 that copper has a relatively low vapor pressure when compared with that of copper chloride shown with line 320. Particularly, it can be seen that a much higher temperature is required to obtain vapor pressures useful for achieving a desirable growth rate of the CIS or CIGS film. For example, copper has to be raised to a temperature of approximately 1200° C. to match the vapor pressure of copper chloride heated to only 300° C. Recognition of the higher vapor pressures of the chloride source of copper when compared with the vapor pressures of elemental sources of metal was one factor that led to the use of these chloride sources in the methods described herein. For example, this allows the use of injectors at port 252 to be maintained at much lower (e.g. 300° C.) and acceptable process temperatures.

As mentioned above, portions of the methods described in U.S. Pat. No. 5,441,897 to Noufi may be modified according to the present disclosure to practice new embodiments for fabricating absorber or CIS/CIGS films for solar cells. More particularly, the new embodiments for fabricating absorber or CIS/CIGS films for solar cells would comprise substitution of $CuCl_x$ for elemental Cu as the source for Cu during vapor treatment. CuCl has about a 15 order magnitude higher vapor pressure than Cu as shown in FIG. 3. This higher vapor pressure provides a number of advantages including energy savings due to the lower temperatures required to create a CuCl vapor and much lower operating/deposition temperatures of equipment facilitating its use in deposition processes.

DISCUSSION OF EXPERIMENTS

At this point in the description, it may be useful to discuss experimentation and study/research performed to further explain unique aspects of the described method and various ways the method may be implemented in practice. One experiment involved evaporating CuCl(s) using a conventional evaporator made up of an evaporant boat of CuCl(s). This evaporator configuration was used, in part, to determine the tooling factor calibration of CuCl as an evaporant (for use in forming a CIS or CIGS film). The resulting film varied in thickness from 6300 to 8900 angstrom (A) and was optically transparent (indeed, was invisible due to CuCl being a wideband gap insulator). Film growth or deposition rates with this reaction chamber were calibrated to A/s. Based on this experiment, it was understood that CuCl could be a wide bandgap replacement for CdS possibly and also be used as a CuCl recrystallization flux, and, it was further principally understood that CuCl could be used as a way to react with Se to form $Cu_xSe$.

In another experiment, an attempt was made to take an existing film of CuCl (e.g., from the above-described experiment) and try to selenize it, i.e., convert it to $Cu_xSe$. $Cu_xSe$ is an intermediate step to form $CuInSe_2$ (CIS), i.e., $Cu_xSe+ In_xSe \rightarrow CIS$. In this experiment, quadrants 3 and 4 of the film from the above-described experiment were used and were heated to a monitor temperature, $T_m$, of ~325° C. for 15 minutes in a flux of Se at ~20 A/s (the calibration curve at this point was $T_{sub}=(1.057 \times T_m)+27$, where $T_{sub}$ is the true substrate temperature and $T_m$ is the monitor temperature. This gives a true substrate temperature of about 370° C. After this run, there was nothing on the substrate, i.e., the CuCl had re-evaporated possibly since the Se flux was not started until the substrate had been raised to the target temperature (e.g., indicating an Se overpressure may be desirable in the formation of a CIS or CIGS film using CuCl vapor as the Cu source).

A follow up experiment was performed to again try to make $Cu_xSe$. Instead of selenizing CuCl films, CuCl and Se were co-evaporated at approximately 15 and 20 A/s, respectively, with the $T_m$ of about 250° C. ($T_{sub}$~290° C.). Final thickness of the CuCl layer transported during the run was noted as ~1 micron, but, surprisingly, there was no film. In a next experiment, approximately 1 micron of CuCl was deposited onto a cold substrate. The substrate was shuttered, and the Se source was brought up to a stable 20 A/s. The shutter was then opened, and the $T_m$ brought up to 250° C. ($T_{sub}$~290° C.) in about 10 minutes and held there for about 10 minutes. In this experiment, the CuCl was heated in a stream of Se to see if $Cu_xSe$ was formed before the CuCl re-evaporated. Unfortunately, it appeared again that there was no film. In another or third follow up experiment, CuCl and Se were co-evaporated at a ratio of Cu:Se of 1:2 in the vapor onto an unheated substrate. Evaporation continued at rates of 10 and 14 A/s, respectively, for enough time to transport enough Cu and Se to form a 2 micron thick CIS film. At the end of this step, the flow of CuCl was turned off, and then the substrate was heated up to a $T_m$ of 250° C. while leaving the Se source on. Again, though, there did not appear to be a noticeable or useful film.

At this point in the process, it may be useful to provide a brief description of some of the additional considerations or factors that were considered in designing a useful method for forming a CIS or CIGS film using CuCl vapor for mass transport. Particularly, it was recognized that the experimental results were showing that forming $Cu_xSe$ was going to be difficult with CuCl as the source. Thermodynamically, there is a way to react CuCl and selenium to form $Cu_xSe$, but it involves the mono-selenide as a reactant. When Se is heated up, there is a distribution of iomers of $Se_x$ where x=1, 2, 3, 4, etc. The enthalpy of reaction for Se(gas) is more positive (56.25 kcal/mole) than $Se_2$(gas) (33.3 kcal/mole).

The following reactions may be considered:

$$2CuCl(solid)+Se_2(gas) \rightarrow 2CuSe(solid)+Cl_2(gas) \quad (1)$$

and

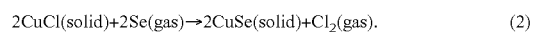

$$2CuCl(solid)+2Se(gas) \rightarrow 2CuSe(solid)+Cl_2(gas). \quad (2)$$

It can be seen from these reactions that: (1) the enthalpy of reaction for the first is positive, i.e., (2)(−10,000)−{(2)(−32,800)+(1)(33,300)}=positive; and (2) the enthalpy of reaction for the second is negative, i.e., (2)(−10,000)−{(2)(−32,800)+(2)(56,250)}=negative. From thermodynamic principles, if a reaction enthalpy is negative, the reaction is possible. Thus, fundamentally, viable reaction pathways for forming CIS and CIGS involve negative enthalpies of reaction. With regards to forming $Cu_xSe$ using CuCl and Se, the type of selenium species is important. If Se can be reduced to a monomer of just Se (perhaps through some type of surface catalysis or decomposition of higher-order Se molecules), then the reaction is favored.

Hence, the only remaining question is whether $In_xSe+ CuCl$ reacted to form CIS is favorable. Significantly, one does not even need to reduce higher-order Se molecules to the (Se) phase in order to make the reaction favorable (note, though, doing so, i.e., converting $Se_x$, where x=2, 3, 4, etc., to Se will always drive the reaction to be more favorable). Rather, it may be possible to do so, by controlling the Se-concentration in the $In_xSe$ phase alone. For example, the reaction of CuCl with $In_2Se_3$ and excess $Se_2$ is not favored. However, the reaction of CuCl with InSe and excess $Se_2$ is thermodynamically favored. This is an interesting aspect as the activity of selenium is present not only in the vapor phase (again, Se is generally better than $Se_2$), but also in the solid $In_xSe$ phase (InSe may be the preferred starting composition). With this discussion of thermodynamic aspects of the deposition or growth of a film using CuCl understood, it may now be useful to return to further experimentation performed based on such recognition by the method designer.

At this point, it would seem difficult to drive the reaction of mixing CuCl and Se to form $Cu_xSe$ possibly due to the limitation of reducing the $Se_2$ to the Se monomer state. The substrate molybdenum or bare glass surface may not provide the type of reduction chemistry to drive $Se_2$ Se. With this in mind, the research direction was altered towards using a 3-stage process where, the first step is to grow a layer of $In_xSe$. There is little concern with the thermodynamics of this step such that experiments concentrated on the second step of the 3-stage process, i.e., reacting $In_xSe$ with CuCl to form CIS.

An initial run or experiment was performed to determine the crosstalk of CuCl flux on an In-monitoring deposition crystal. Knowledge of this crosstalk is useful in order to use the In-monitoring deposition crystal to monitor the $In_xSe$ deposition rate. Further, a calibration run or experiment was performed for evaporating $In_xSe$ powder from a boat. This sets the tooling factor so that the $In_xSe$ deposition rate is known or readily determined.

With these calibration-type experiments completed, another experiment was performed that involved co-evaporating CuCl+$In_xSe$ and Se onto a molybdenum coated substrate ($T_m$) heated to about 450° C. Deposition time was about 12 minutes. The rates used were CuCl at 12-15 A/s, $In_xSe$ at 20 A/s, and Se at 25-30 A/s. This is a higher than normal overpressure of Se relative to previous runs. The resulting film appeared to be a useful CIS film. Resistance varied from 120 Mohm down to 0.147 Kohm suggesting compositions were straddling Cu-poor to Cu-rich, respectively. Targeted thickness was 2.1 microns while actual thickness was 2.3 micron suggesting good incorporation of Cu, In, and Se.

Actual measured compositions were somewhat Se-deficient as films became Cu-rich suggesting some process tweaking may be desirable. Measured composition at 3 points along the gradient showed: Cu (at %)/In (at %)/Se (at %)=27.02/20.33/52.65; 35.25/18.91/45.84; and 50.75/9.55/39.70. At the time of the experimental run, it was believed that the compositional variations may have been due to issues in attempting to uniformly heat the substrate.

This experiment was then repeated to attempt to get tighter control. In the experiment, CuCl, $In_xSe$, and Se rates were 10-14, 20-25, and 25-29 A/s, respectively. The substrate temperature was at $T_m$=490-500° C., which was somewhat higher than the prior experiment. The resulting or entire film appeared to be Cu-rich from resistance measurements, even though the Cu/In ratio for this experiment was less than what it was for the prior run. Apparently, therefore, higher temperature appears to drive off indium from the film. Interestingly, whereas prior experiments incorporating Cu with into films using CuCl sources had not been successful, these experiments co-evaporating CuCl with $In_xSe$ and Se were capable of incorporating Cu. However, these first two experiments (after the thermodynamic study or analysis) were more about incorporating CuCl and $In_xSe$ together rather than sequentially.

In a later experiment, the film from the previously-discussed experiment (which was essentially a Cu-rich, CIS film) was subjected to a flux of $In_xSe$+Se to see if the film could be made Cu-poor. Basically, this was an attempt to replicate the third step of the 3-stage process but after use of CuCl as a source for making a Cu-rich film (e.g., making a Cu-rich film, Cu-poor by treating it in $In_xSe$+Se vapor). In this experiment, part of the film was heated to a temperature, $T_m$, of 500° C., in a flux of $In_xSe$ (10 A/s) and Se (20 A/s). The film still appeared to be Cu-rich. It was believed at this time that perhaps not enough $In_xSe$ was used. The $In_xSe$ flux occurred during the initial time at $T_m$=500° C. After 10 minutes, the $In_xSe$ flux was turned off, but the Se flux was kept on while the substrate cooled to about $T_m$=300° C. It was estimated that about 2840 A of $In_xSe$ was used during this anneal, and, hence, a conclusion was that possibly this amount was not enough to convert the Cu-rich CIS to Cu-poor CIS.

In a next experiment, another run was performed involving the co-evaporation of CuCl (10-13 A/s), $In_xSe$ (20-25 A/s), and Se (very high; 35-40 A/s), at a $T_m$=500° C. When turning off sources, the CuCl source drops faster than the In source; thus, the surface of the CIS appears to terminate with more of an In-flux. The film composition came in at 11.83/32.63/55.54, which is very close to the 1:3:5 (ordered-vacancy-compound, OVC) phase. At the time, this phase was suspected as being a desired "Cu-poor" phase for making good CIS devices, and it was likely that the higher Se overpressure was useful and possibly even necessary in some cases for making this phase.

Another run or experiment was performed involving co-evaporating CuCl, $In_xSe$ and Se again at a $T_m$ of about 470° C. (slightly cooler) but with Se dropped down to only 25-30 A/s. Cu and In rates were 10-13 and ~20 A/s respectively. Again, the CuCl rate dropped off faster at the end of run. The resulting film turned out to be Cu-rich, and part of this film was set aside to study whether subsequent $In_xSe$ treatments could make it Cu-poor. Note that the Se activity appears to affect the Cu/In ratio more than temperature. A lower substrate temperature (based upon results of earlier experiments discussed above) would have suggested this film to have been Cu-poor. Rather, it was Cu-rich, and a plausible explanation is that, in the case of this experiment compared to the immediately previous one, it was the lower Se flux that caused this film to be Cu-rich.

In the next experiment, the run involved another co-evaporation of CuCl, $In_xSe$, and Se. This time at $T_m$=475° C. and Cu, In, and Se rates of ~10, ~20, and 30 A/s. This film showed a Cu-rich to Cu-poor gradient. Again, there was a strong indication that the Se rate and substrate temperature determine the ability of the CuCl to combine with $In_xSe$ vapor to form either Cu-rich or Cu-poor CIS.

The next experiment involved a treatment of the previously saved film (which had been strongly Cu-rich) in a flux of $In_xSe$+Se vapor to make it Cu-poor. The Se flux was brought up to ~20 A/s first, followed by the $In_xSe$ flux up to about 10 A/s. Using a witness slide (a bare glass substrate placed next to X16), it was determined that about 5000 A of $In_xSe$ had been deposited during this treatment. The resulting film showed a gradient of Cu-poor (resistance=17 Mohm) to Cu-rich (160 ohm) CIS. Note that this is an experiment similar to the one discussed above where an attempt was made to replicate the third step of the 3-stage process (i.e., making a Cu-rich film, Cu-poor by treating it in $In_xSe$+Se vapor). In the prior experiment, only 2840 A of $In_xSe$ was used whereas in contrast in this experiment this has been doubled to about 5000 A. Thus, the conclusions from the prior experiment (that not enough $In_xSe$ was used) appear to have been warranted. Hence, at this point in the experimentation, the conclusion was that a Cu-rich CIS film made using CuCl can be effectively converted into a Cu-poor CIS film for use as an absorber in a solar cell.

In the next experiment, an attempt was made to replicate the second step of the 3-stage process but with the unique modifications described herein. From the prior experiment, the third step was shown possible, and, again, as discussed in with regard to the thermodynamics of the film fabrication above, the first step is likely readily achievable. Hence, all that remained was determining whether the second step is possible (i.e., converting an $In_xSe$ film into a Cu-rich CIS film).

To this end, a film of $In_xSe$ was deposited on the substrate by depositing from an $In_2Se_3$ source at 10 A/s for ~23 minutes to grow an $In_xSe$ film with a thickness of about 14,000 A. This was done simultaneously with a flux of Se at 18-20 A/s. The substrate was held at 200° C. during this step. Without breaking the vacuum in the reaction chamber, the $In_2Se_3$ source was turned off, and the CuCl source was brought up to a rate of about 6 A/s. At the same time, the substrate (now coated with $In_xSe$) was heated to a $T_m=480°$ C. The CuCl flux was maintained for about 22.7 minutes for a total Cu transport of 8180 A at which point the CuCl source was turned off and the film was allowed to cool in a flux of Se to about 300° C. This film was Cu-poor and the XRD showed strong OVC (i.e., Cu-poor CIS) phase formation.

Since the film from the prior experiment was Cu-poor, but the second stage of the 3-stage or step CIS or CIGS film formation process prefers (but does not require) a film that is Cu-rich, a way was needed to increase Cu in the film. In the prior experiment, relative thicknesses of $In_xSe$ and CuCl used during the first and second steps were 14,000 A and 8100 A, respectively, for a Cu/In ratio of 0.578. In the following two experiments, these thicknesses were adjusted for ratios of 0.73 and 0.76, respectively, in order to increase the amount of Cu. For the first of these two follow up experiments, the Se rate was reduced during the second step while also reducing CuCl flux to 15-16 A/s. It appears that the films produced in these two experiments remained Cu-poor though the second follow up experiment did show towards one side of the film a slightly lower resistance suggesting that progress was being made toward getting the films to be Cu-rich.

At these conditions of temperature and Se overpressure, it was a bit difficult to incorporate Cu, i.e., the composition tended to terminate towards a Cu-poor material. These results combined with the strong observations of OVC phases suggested that some tuning of the process could be used to terminate a Cu-poor surface (useful for the third stage of the process). From a manufacturing perspective, this could be an advantage, particularly when Cu-poor surfaces are desired.

In a later experiment, the temperature, $T_m$, was increased during the CuCl treatment as well as an increase of the CuCl flux to make the film more Cu-rich. A temperature $T_m$ of 500-510° C. was used, and a Cu/In thickness ratio of 1.16 was set. The experiment produced or made the film Cu-rich. The results of this experiment may have been achieved due, in part, to the slightly higher temperature, but it is more or just as likely the much greater ratio of Cu/In that caused the film to be more Cu-rich.

Since the above experiments proved that a good Cu-rich film (after stage 2) can be readily produced using CuCl vapor, the experiment can be continued to introduce the third stage (treatment with InSe to make film again Cu-poor). Part of the film from the prior experiment (quadrants 3,4) were heated up to $T_m=300°$ C. Then, the Se was brought up to 20 A/s while continued heating up the substrate to $T_m505°$ C. The process was continued for 2 minutes, and then the $In_2Se_3$ source was turned on to about 5 A/s and transferred about 2510 A of InSe at $T_m=505°$ C. Also, the experiment used Se at 19-20 A/s. A similar experiment was run but used remaining part of the film (quadrants 1,2) and treated with 1255 A of InSe at $T_m=510°$ C. Used same procedure of raising temperature of film to 300° C., turning on and stabilizing the Se source, continuing to heat to 510° C. at which point the $In_2Se_3$ source was brought up to 4-5 A/s. This experiment may not have provided enough InSe treatment, so it was repeated with an additional 1000 A of InSe flux.

A later experiment involved a repeat of the process involving first, the deposition of a 18,860 A InSe film at $T_m=230-240°$ C. (this time with no Se; thermodynamically, InSe is better than $In_2Se_3$) followed by a CuCl+Se treatment at $T_m=510°$ C. During this experiment, 8249 A of CuCl was transported during the latter step. Both the CuCl and InSe amounts are greater this time since the experiment was targeting a 2.5 micron film. The amount of Cu used in this run, should have made the film slightly Cu-poor, but, again, it was Cu rich, suggesting some In loss in the process. This experiment was followed by preparatory calibration runs for use of $Ga_2Se_3$, $In_2Se_3$, and CuCl to form films as discussed in the methods described herein.

In another later experiment, stages 1 and 2 of the three stage process were performed, but the resulting film was mostly Cu-poor. The first stage involved 14,000 A of InSe film deposited at $T_m=240-250°$ C. at 5-6 A/s. There was no Se during this step. The film was then raised to 510-515° C., Se brought up to 25 A/s, and CuCl was brought up to about 5 A/s. Approximately, 8003 A of CuCl was transported. The Se source was maintained for 2 min after the CuCl was turned down. The film was mostly Cu-poor though there was a gradient. These resulted in active cells with moderately good (~6%) efficiency.

In another experiment, cells were produced using an absorber formed using CuCl that were good efficiency. These involved stages 1-3 of the three stage process. In this experiment, 14,000 A of $In_xSe$ was first deposited at a $T_m=240-250°$ C. at 5-6 A/s without Se. Then the temperature was increased to $T_m=514-515°$ C., and CuCl and Se sources increased to 5 A/s and 20 A/s, respectively. The method of the experiment included transporting 9040 A of CuCl during this step. Then, without changing temperature, turning off both CuCl and Se, turning on the $In_2Se_3$ source to 5 A/s, and transporting another 1730 A of $In_xSe$, thereby converting the Cu-rich CIS back to Cu-poor. Then, the experimental method included turning off the $In_2Se_3$ source, bringing the Se back up to ~15 A/s, and cooling the substrate to about 300° C., and then shutting down the system (turning all devices off). These substrates with the CIS films made good solar cells.

At the end of this experimental and testing work, working solar cells had been made using only the first and second stages (where the resulting film surface was Cu-poor) and also using the first, second, and third stages, where after the second stage the film surface was Cu-rich.

While a number of exemplary aspects and embodiments have been discussed above, those of skill in the art will recognize certain modifications, permutations, additions, and sub-combinations thereof. It is therefore intended that the following appended claims and claims hereafter introduced are interpreted to include modifications, permutations, additions, and sub-combinations to the exemplary aspects and embodiments discussed above as are within their true spirit and scope.

During experimentation in which many aspects of the above describe method were designed or discovered, it was first documented that CIS thin films could be grown in a closed-space sublimation (CSS) arrangement using various compounds containing Cu, In, and Se. Some preliminary materials (e.g., $Cu_xSe$, $In_xSe$, and Se) were identified as well as some not-so-well known material possibilities (CuCl, CuBr, $Cu(C_2H_3O_2)_2$, CuF). Also, the experiments and research suggested the synthesis of Cu-metal-organic compound precursors including the reaction of CuCl with Na(h-fac).

Subsequent experimentation or work involved testing out the use of CuCl as a volatile Cu-transporting agent for such processes by simulating different reaction pathways in a conventional multi-source evaporator. CIS was successfully fabricated using $In_xSe$ precursors and CuCl vapors. The high volatility of CuCl tended to make the films Cu-deficient, which is preferred for making CIS-based devices including solar cells. Subsequent reaction pathways included the co-evaporation of CuCl with $In_xSe$ and Se to directly from Cu-poor CIS films, and the direct conversion of $In_xSe$ precursors with subsequent treatments in CuCl vapor.

Cu-rich films fabricated by using CuCl were also converted to Cu-poor films using two-step approaches using $In_xSe$ vapors. Cell performance during many subsequent experiments reached about 7 percent. Though experiments to date were not performed in a CSS arrangement, experiments were designed to test the feasibility of growing CIS using sources other than elemental Cu, In, and Se in particular as might be applied to a CSS-like arrangement. CSS represents a much faster method for depositing CIS films and in its related form, i.e., vapor transport, has been shown to be manufacturable at a very high scale (e.g., vapor transported CdTe). This work is believed to be the first conceptualization of CIS formation by CSS and vapor transport processes reduced to actual practice including production of working solar cells.

It may be useful at this point to further discuss the specific stoichiometries that may be utilized. With the exception of the chemical formulas given, the stoichiometry of phases is always questionable. However, if one is working with a source, it may be appropriate to specify the stoichiometry of the source (i.e., $In_2Se_3$ or $Cu_2Se$) since this is information stated on a label on the bottle or other container from a distributer or provider. However, in a film, it typically is presumptuous to specify the film as $In_2Se_3$ or the like since films are rarely single-phase, i.e., a film that is predominately $In_2Se_3$ probably contains other $In_xSe$ phases. Thus, the above discussion often does not to specify the stoichiometry of the resulting or produced $Cu_xSe$ or $In_xSe$ films and vapors. It is preferable to use the more general use of "x" when it comes to the condensed, deposited film or the evaporated vapor.

While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations.

What is claimed is:

1. A method for fabricating a thin film device, the method comprising:
providing a semiconductor film comprising Indium (In) and Selenium (Se) upon a substrate;
heating the substrate and the semiconductor film to a desired temperature; and
performing a mass transport through vapor transport of a copper chloride vapor and a Se vapor to the semiconductor film within a reaction chamber, wherein:
the semiconductor film comprises one of $In_xSe$ or $(In,Ga)_xSe$, and
performing the mass transport comprises injecting the copper chloride vapor and the Se vapor into the reaction chamber until the semiconductor film includes a copper-rich region.

2. The method of claim 1, where heating the substrate and the semiconductor film comprises heating the substrate to a temperature in the range of 475 to 600° C. prior to flowing the copper chloride vapor into the reaction chamber.

3. The method of claim 1, wherein the copper chloride vapor is produced by heating solid copper chloride to a temperature of at least 275° C.

4. The method of claim 1, further comprising:
after performing the mass transport, treating a film produced by the mass transport in a flux of In by providing a source of In to the reaction chamber.

5. The method of claim 4, wherein the flux of In is produced by an In source comprising at least one of In, $In_2Se_3$, or $In_xSe$.

6. The method of claim 4, further comprising:
treating the film produced by the mass transport in a flux of Ga by providing a source of Ga to the reaction chamber.

7. The method of claim 6, wherein the flux of Ga is produced by an Ga source comprising at least one of Ga, or $Ga_xSe$.

8. The method of claim 1, further comprising maintaining the substrate at the desired temperature while treating a film produced by the mass transport in a flux of In.

9. The method of claim 1, wherein the substrate further comprises a back contact layer.

10. The method of claim 9, wherein the back contact layer comprises a film of molybdenum (Mo).

11. A method of fabricating a film, the method comprising:
providing a substrate and a film comprising indium and selenium;
flowing selenium vapor over the film; and
concurrently with the flowing of the selenium vapor, flowing copper chloride vapor over the film.

12. The method of claim 11, wherein the substrate is heated to a temperature in the range of 475 to 600° C. prior to the flowing of the copper chloride vapor.

13. The method of claim 11, wherein a source of the copper chloride vapor is solid copper chloride heated to a temperature of at least about 275° C.

14. The method of claim 11, wherein the flowing steps are performed with flow rates and for a duration whereby the film includes a copper-poor region.

15. The method of claim 11, wherein the flowing steps are performed with flow rates and for a duration whereby the film includes a copper-rich region.

16. The method of claim 11, further comprising limiting reaction of selenium and copper to the film on the substrate.

17. The method of claim 11, wherein the flowing of the selenium vapor provides an overpressure of selenium.

18. The method of claim 11, wherein the indium and selenium film comprises $In_2Se_3$.

19. The method of claim 11, wherein the substrate comprises a glass substrate with a coating of molybdenum.

20. A method of forming a p-type film for a photovoltaic device, comprising:
on a substrate coated with a back contact film, depositing a film comprising indium and selenium;
in the film comprising indium and selenium, forming $Cu_xSe$ by injecting copper chloride vapor onto the substrate until the film with $Cu_xSe$ is Cu-rich; and
after the forming, treating the film with In to provide a Cu-poor region opposite the back contact film.

21. The method of claim 20, wherein treating the film with In comprises:
treating the film in a flux of In by providing a source of In to a reaction chamber, wherein the flux of In is produced by an In source comprising at least one of In, $In_2Se_3$, $In_xSe$, (In,Ga) or $(In,Ga)_xSe$.

22. The method of claim 20, wherein the film formed in the depositing step further includes gallium.

23. The method of claim 20, further comprising, concurrently with the forming of the $Cu_xSe$, providing an overpressure of selenium over the substrate.

24. The method of claim 20, further comprising, heating the substrate to a temperature in the range of 475 to 600° C. prior to injecting the copper chloride vapor.

25. The method of claim 20, wherein the forming of the $Cu_xSe$ includes operating an injector heated to at least about 300° C. to provide the CuCl vapor.

26. A method for fabricating a thin film device, the method comprising:

providing a semiconductor film comprising Indium (In) and Selenium (Se) upon a substrate;

heating the substrate and the semiconductor film to a desired temperature; and performing a mass transport through vapor transport of a copper chloride vapor and a Se vapor to the semiconductor film within a reaction chamber, wherein:

the semiconductor film comprises one of $In_xSe$ or $(In,Ga)_xSe$, and performing the mass transport comprises injecting the copper chloride vapor and the Se vapor into the reaction chamber until the semiconductor film includes a copper-poor region.

27. The method of claim 26, where heating the substrate and the semiconductor film comprises heating the substrate to a temperature in the range of 475 to 600° C. prior to flowing the copper chloride vapor into the reaction chamber.

28. The method of claim 26, wherein the copper chloride vapor is produced by heating solid copper chloride to a temperature of at least 275° C.

29. The method of claim 26, wherein the substrate further comprises a back contact layer.

30. The method of claim 29, wherein the back contact layer comprises a film of molybdenum (Mo).

* * * * *